United States Patent
Luo et al.

(10) Patent No.: US 8,470,662 B2
(45) Date of Patent: Jun. 25, 2013

(54) SEMICONDUCTOR DEVICE AND METHOD OF MANUFACTURING THE SAME

(75) Inventors: Zhijiong Luo, Poughkeepsie, NY (US); Huilong Zhu, Poughkeepsie, NY (US); Haizhou Yin, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 80 days.

(21) Appl. No.: 13/063,538

(22) PCT Filed: Jun. 28, 2010

(86) PCT No.: PCT/CN2010/074584
§ 371 (c)(1),
(2), (4) Date: Mar. 11, 2011

(87) PCT Pub. No.: WO2011/079604
PCT Pub. Date: Jul. 7, 2011

(65) Prior Publication Data
US 2012/0181617 A1 Jul. 19, 2012

(30) Foreign Application Priority Data
Dec. 29, 2009 (CN) .......................... 2009 1 0244134

(51) Int. Cl.
*H01L 21/8238* (2006.01)
(52) U.S. Cl.
USPC .......................................... 438/230; 257/369
(58) Field of Classification Search
USPC ....................................................... 257/369
See application file for complete search history.

(56) References Cited

U.S. PATENT DOCUMENTS

| 6,596,599 | B1 * | 7/2003 | Guo ............................. 438/305 |
| 8,035,173 | B2 * | 10/2011 | Bu et al. ........................ 257/410 |
| 2008/0099851 | A1 | 5/2008 | Hsu |
| 2008/0272438 | A1 * | 11/2008 | Doris et al. .................... 257/369 |
| 2008/0272445 | A1 * | 11/2008 | Dyer ............................. 257/412 |
| 2009/0291553 | A1 * | 11/2009 | Doris et al. .................... 438/591 |

FOREIGN PATENT DOCUMENTS

| CN | 1437269 A | 8/2003 |
| CN | 101425479 A | 5/2009 |

OTHER PUBLICATIONS

International Search Report for PCT/CN2010/074584.

* cited by examiner

*Primary Examiner* — Robert J Hoffberg
*Assistant Examiner* — Priya Rampersaud
(74) *Attorney, Agent, or Firm* — Troutman Sanders LLP.

(57) ABSTRACT

The present invention relates to a semiconductor device and a manufacturing method for making the same, wherein, according to the method, after the gate stack is formed, a buffer layer is formed on sidewalls of an PMOS gate stack, the buffer layer being formed of a porous low-k dielectric layer; and then, sidewall spacers and source/drain/halo regions, and source and drain regions are formed for the device; and finally, a high-temperature anneal is conducted in an oxygen environment such that the oxygen in the oxygen environment diffuse through the buffer layer into the high-k dielectric layer of the second gate stack. The present invention lowers threshold voltage of the PMOS device without affecting the threshold voltage of the NMOS device, avoids damages to the gate and substrate incurred by removing the PMOS sidewall spacer in a traditional process, and hereby effectively improves the overall performance of the device.

12 Claims, 6 Drawing Sheets

SEMICONDUCTOR DEVICE AND METHOD OF MANUFACTURING THE SAME

FIELD OF THE INVENTION

The present invention generally relates to a semiconductor device and a manufacturing method thereof, and more specifically, to a device with a lower PMOS threshold voltage of a high-k gate dielectric/metal gate device and a method of manufacturing the same.

BACKGROUND OF THE INVENTION

With the development of the semiconductor technology, integrated circuits with higher performance and more powerful functions require enhancement of the element density, and the sizes of the components and spaces between the components need to be scaled further. Moreover, 32/22 nanometer technology has been an inevitable trend of the development of integrated circuits, and become a topic competitively studied by major international semiconductor corporations and research institutions. Also, the gate engineering for CMOS devices, the core of which is "high-k dielectric/metal gate" technology, is the most representative technique in 32/22 nanometer technology, and its relevant studies on materials, processes, and structures have been in progress widely.

By a metal gate integrated with a high-k gate dielectric material, a transistor having a high mobility channel has been realized. However, due to the high-temperature processes during the integration, the property of the interface between the metal and high-k insulating material is changed and oxygen vacancies are brought into the high-k gate dielectric material, which disadvantageously leads to increasing of the PMOS threshold voltage and deterioration of the device reliability. Thus, it has become a most important task in manufacturing a "high-k dielectric/metal gate" device to effectively control the PMOS threshold voltage. At present, a solution to lower the PMOS threshold voltage of a "high k-gate dielectric/metal gate" device by oxygen diffusion (see Symposium on VLSI technology Digest of Technical Papers, 2009) may be used. This solution is based on removing the sidewall spacer and diffusing oxygen into the high-k dielectric material from the sidewalls of the high-k/metal gate. However, this method needs to remove the sidewall spacer. Removal of sidewall spacer is rather hard to control and often damages the gate dielectric layer, the gate electrode, and the source/drain regions, and thus degrades the performance of the device.

Therefore, there is a need for a method to manufacture a semiconductor device and a corresponding device structure, in which the threshold voltage of a PMOS device can be lowered without causing damages to the device.

SUMMARY OF THE INVENTION

In view of the above-mentioned problems, the present invention proposes a method for manufacturing a semiconductor device. The method comprises: providing a semiconductor substrate having an NMOS region and a PMOS region; forming a first gate stack in the NMOS region on the semiconductor substrate, and forming a second gate stack in the PMOS region on the semiconductor substrate, wherein the formation of the first gate stack comprises forming a first high-k gate dielectric layer and a first metal gate electrode thereon, and the formation of the second gate stack comprises forming a second high-k dielectric layer and a second metal gate electrode thereon; forming a buffer layer on sidewalls of the second gate stack, wherein the buffer layer is formed of a low-k dielectric material; forming a first sidewall spacer on sidewalls of the first gate stack, and forming a second sidewall spacer on sidewalls of the buffer layer; forming a source region and a drain region for each of the NMOS region and PMOS region in the semiconductor substrate; and annealing the device in an oxygen environment, such that oxygen in the oxygen environment being diffused into the second high-k gate dielectric layer of the second gate stack through the buffer layer.

Furthermore, the following alternate method may be used to manufacture a semiconductor device. The method comprises: providing a semiconductor substrate having an NMOS region and a PMOS region; forming a first gate stack in the NMOS region on the semiconductor substrate, and forming a second gate stack in the PMOS region on the semiconductor substrate, wherein the formation of the first gate stack comprises forming a first high-k gate dielectric layer and a first metal gate electrode thereon, and the formation of the second gate stack comprises forming a second high-k dielectric layer and a second metal gate electrode thereon; forming a buffer layer on sidewalls of the second gate stack, wherein the buffer layer is formed of a low-k dielectric material; forming a first sidewall spacer on sidewalls of the first gate stack, and forming a second sidewall spacer on sidewalls of the buffer layer; forming a source region and a drain region for each of the NMOS region and PMOS region in the semiconductor substrate; removing the second sidewall spacer; and annealing the device in an oxygen environment, such that oxygen in the oxygen environment is diffused into the second high-k gate dielectric layer of the second gate stack through the buffer layer.

In accordance with another aspect of the present invention, a semiconductor device is further provided, comprising: a semiconductor substrate having an NMOS region and a PMOS region, wherein the NMOS region and the PMOS region are isolated from each other; a first gate stack formed in the NMOS region on the semiconductor substrate and a second gate stack formed in the PMOS region on the semiconductor substrate; and a source region and a drain region formed in the semiconductor device for each of the NMOS region and the PMOS region; wherein the first gate stack comprises: a first high-k gate dielectric layer; and a first metal gate electrode formed on the first high-k gate dielectric layer, and the second gate stack comprises: a second high-k dielectric layer; and a second metal gate electrode formed on the second high-k gate dielectric layer;

wherein a buffer layer is formed on sidewalls of the second gate stack, and the buffer layer enables the diffusion of oxygen in the oxygen environment, during annealing of the device in an oxygen environment, into the second high-k gate dielectric layer of the second gate stack through the buffer layer.

By virtue of the device structures and manufacturing methods as described in the present invention, oxygen atoms can be diffused into a high-k gate dielectric material layer where a PMOS is located, and thus, the present invention can well lower the threshold voltage of the PMOS device without affecting the threshold voltage of the NMOS device. Furthermore, the present invention advantageously avoids negative damages to the gate and substrate by the removal of PMOS sidewall spacer in a traditional process, and thus the overall performance of the device can be effectively enhanced.

DETAILED DESCRIPTION OF THE INVENTION

The present invention generally relates to a semiconductor device and a method of manufacturing the same. The following disclosure provides a plurality of different embodiments or examples to achieve different structures of the present invention. To simplify the disclosure of the present invention, components and arrangements of some specific examples are described below. Of course, they are only illustrative and not limiting the present invention. Moreover, reference numbers and/or letters may be repeated in different embodiments. Such a repetition is for the purposes of simplification and clearness, and does not denote the relationship between respective embodiments and/or arrangements being discussed. In addition, the present invention provides various examples for specific processes and materials. However, it will be understood by a person of ordinary skill in the art that other processes and/or materials may alternatively be utilized. Furthermore, the following structure in which a first object is "on" a second object may include an embodiment in which the first object and the second object are formed to be in direct contact with each other, and may also include an embodiment in which another object is formed between the first object and the second object such that the first and second objects might not be in direct contact with each other.

Embodiment 1

Figure 1:
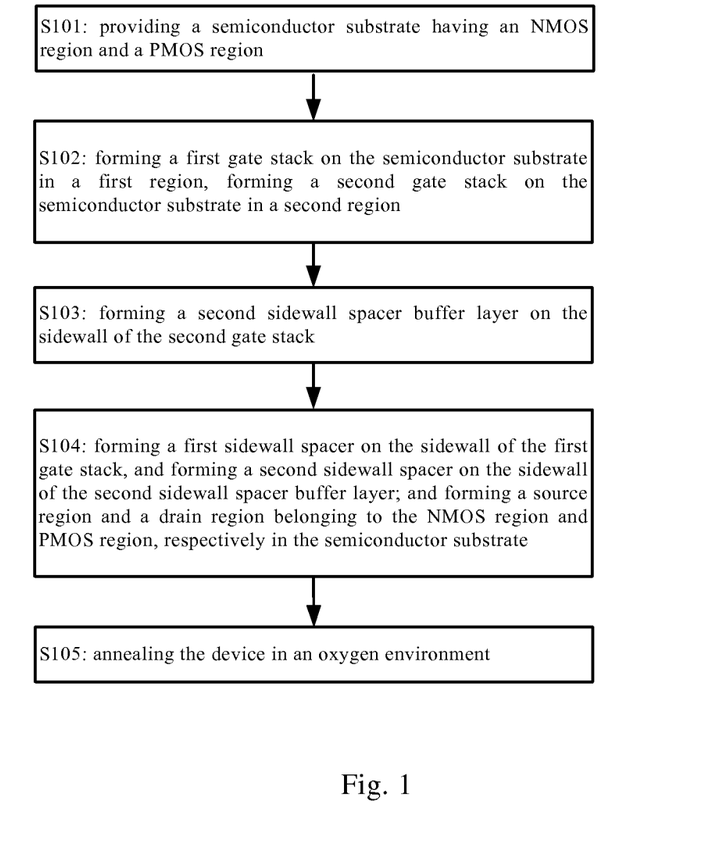
FIG. 1 is a flowchart illustrating a method for manufacturing a semiconductor device according to a first embodiment of the present invention.
Figure 2:
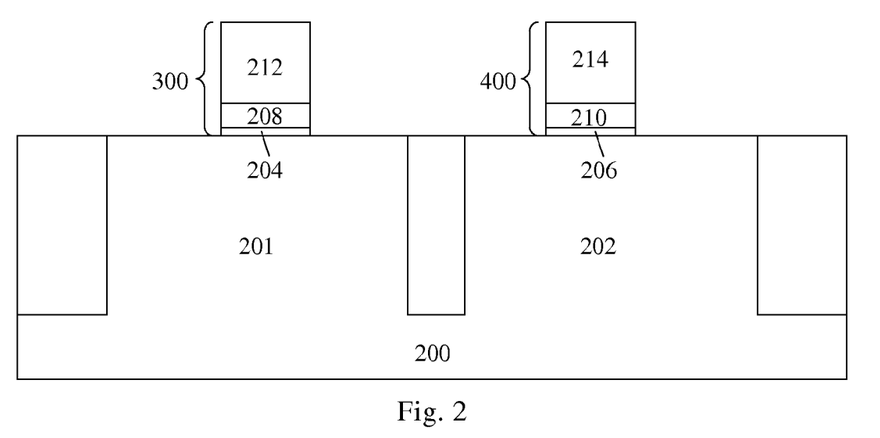
FIGS. 2-6 are diagrams illustrating the stages for manufacturing a semiconductor device according to the first embodiment of the present invention.

With reference to FIG. 1, FIG. 1 is a flowchart of a method for manufacturing a semiconductor device according to one embodiment of the present invention. In step 101, a semiconductor substrate 200 having an NMOS region 201 and a PMOS region 202 is provided, wherein the NMOS region 201 and the PMOS region 202 are isolated from each other, as shown in FIG. 2. In this embodiment, the substrate 200 includes a crystalline silicon substrate (for example, a wafer) and may also include other semiconductors or compound semiconductors, for example, Ge, GeSi, GaAs, InP, SiC, and diamond, etc. According to the design specifications known in the prior art (for example, a p-type substrate or an n-type substrate), the substrate 200 may be of various doping configurations. Further, optionally, the substrate 200 may include an epitaxial layer, may be under stress for performance enhancement, and/or may include a SOI (silicon on insulator) structure.

In step S102, a first gate stack 300 is formed on the semiconductor substrate 200 in the NMOS region 201, and a second gate stack 400 is formed on the semiconductor substrate 200 in the PMOS region 202, as shown in FIG. 2. The first gate stack 300 and the second gate stack 400 are multi-layered gate stack structures comprising a high-k gate dielectric and a metal gate. In this embodiment, $HfO_2$, TiN, and polysilicon are deposited on the semiconductor substrate 200 in sequence in order to form a high-k dielectric layer, a metal gate electrode and a polysilicon layer, respectively. Then the semiconductor substrate is patterned by dry or wet etching, in order to form a first gate stack 300 and a second gate stack 400 as shown in FIG. 2, wherein the first gate stack 300 comprises a first high-k gate dielectric layer 204, a first metal gate electrode 208, and a first polysilicon layer 212 in the NMOS region 201, and the second gate stack 400 comprises a second high-k gate dielectric layer 206, a second metal gate electrode 210, and a second polysilicon layer 214 in the PMOS region. The above description is only illustrative, and the present invention is not limited thereto. For instance, the first gate stack 300 and the second gate stack 400 may also be other multi-layered gate stack structures comprising a high-k gate dielectric layer and a metal gate layer. Moreover, the material of the high-k dielectric layer may include at least one of $HfZrO_x$, $Al_2O_3$, $Gd_2O_3$, etc., and the material for the metal gate electrode may include at least one of TaN, $Ta_2C$, HfN, HfC, TiC, Mo, Ru, etc. The gate stacks may be deposited by, for example, Chemical Vapor Deposition (CVD), Physical Vapor Deposition (PVD), Atom Layer Deposition (ALD), and/or other suitable processes.

Figure 3:
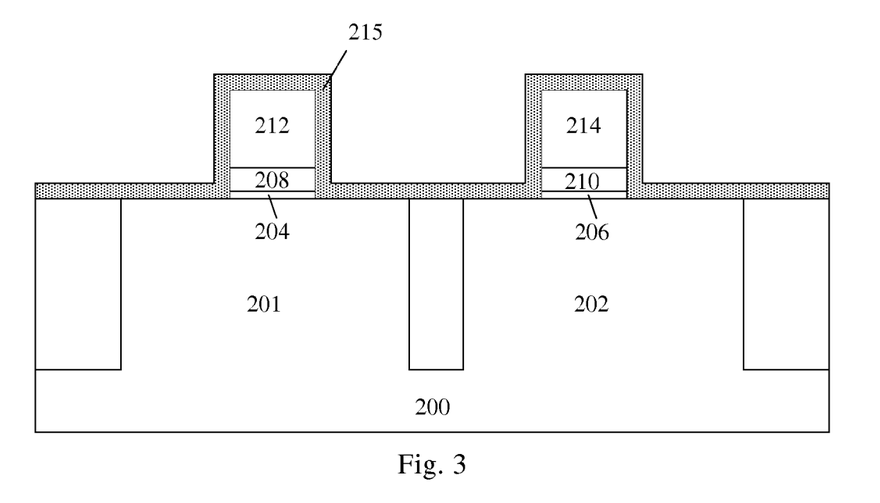
Figure 4:
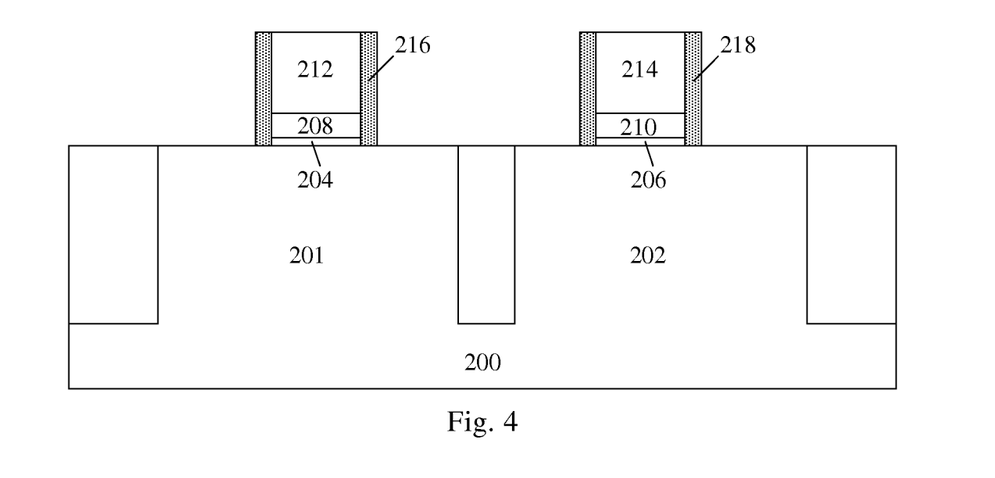
Figure 5:
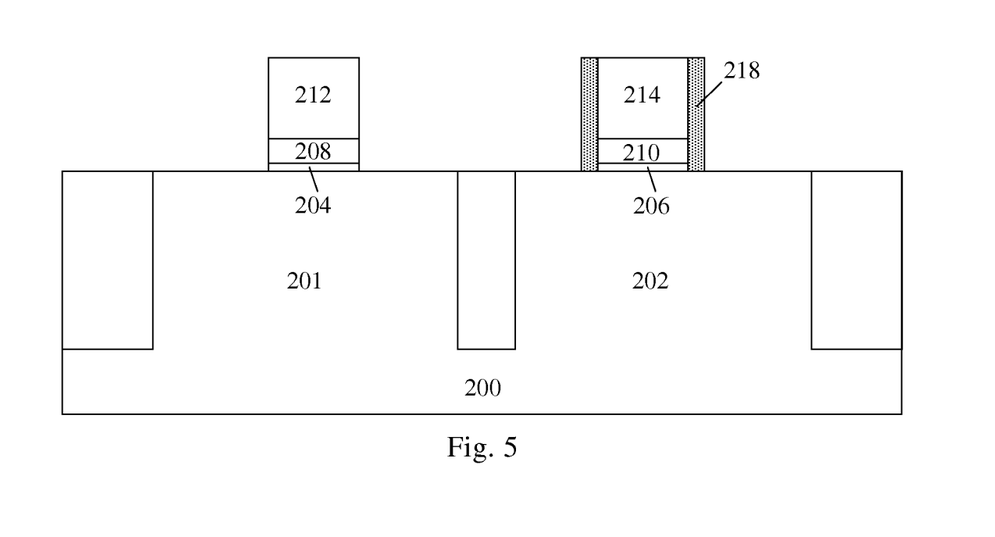

In step S103, a spacer buffer layer 218 is formed on the sidewalls of the second gate stack 400. As shown in FIG. 3, a low-k dielectric layer 215 is deposited on the device and then the low-k dielectric layer 215 is patterned by reactive ion etching (RIE) in order to form a buffer layer 216 belonging to the NMOS region 201 and a buffer layer 218 belonging to the PMOS region 202, as shown in FIG. 4. And then, the PMOS region 202 is masked, the buffer layer 216 in the NMOS region 201 is removed by dry or wet etching, and the mask on PMOS region 202 is removed, so as to form a buffer layer 218 of the second gate stack 400, as shown in FIG. 5. The thickness of the buffer layer 218 is in the range from about 1 to 100 nm. The buffer layer 218 is formed of a low-k dielectric material which may be SiCOH, SiO or SiCO, etc., and the relative dielectric constant of the low-k dielectric material is less than 3.5. Since the low-k dielectric material has a porous structure, the buffer layer formed of it can serve as a passage for subsequent oxygen atom diffusion. Moreover, because the buffer layer has a porous structure, it is rather easy to be removed, and therefore it causes less damages to the gate and substrate during its removal. The low-k material may be deposited by, for example, Chemical Vapor Deposition (CVD), Physical Vapor Deposition (PVD), Atom Layer Deposition (ALD), and/or other suitable methods.

Figure 6:
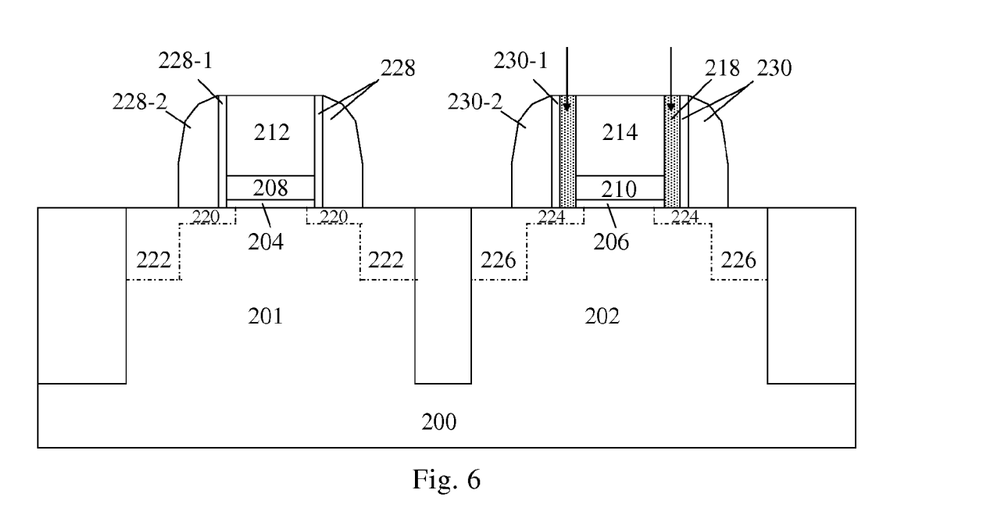

In step S104, a first sidewall spacer 228 is formed on the sidewalls of the first gate stack 300; a second sidewall spacer 230 is formed on the sidewalls of the buffer layer 218; source/drain extension regions and/or halo regions 220, source and drain regions 222, which all belong to the NMOS region 201, are formed in the semiconductor substrate 200; and source/drain extension regions and/or halo regions 224, source and drain regions 226, which all belong to the PMOS region 202, are formed in the semiconductor substrate 200, as shown in FIG. 6. The first sidewall spacer 228 and the second sidewall spacer 230 may be multi-layered structures, and may be formed of one or more materials selected from the group comprising silicon nitride, silicon oxide, silicon oxynitride, silicon carbide, and fluoride dopant silicon glass, and/or other suitable materials. In this embodiment, the first sidewall spacer 228 and the second sidewall spacer 230 are two-layered structures. By deposition and etching, a first layer of the first sidewall spacer layer 228-1 and a first layer of the second sidewall spacer layer 230-1, both of which being $Si_3N_4$, and a second layer of the first sidewall spacer layer 228-2 and a second layer of the second sidewall spacer layer 230-2, both of which being $SiO_2$, are formed, as shown in FIG. 6. The above description is only illustrative, and the present invention is not limited thereto. The sidewall spacer may be deposited by, for example, Chemical Vapor Deposition (CVD), Physical Vapor Deposition (PVD), Atom Layer Deposition (ALD), and/or other suitable methods.

Preferably, source/drain extension regions and/or halo regions may be formed before forming the source and drain regions. Source/drain extension regions and/or halo regions 220, 224 may be formed by implanting p-type or n-type dopants or impurities into the substrate 200 of the NMOS region 201 and PMOS region 202 depending on desired transistor structures (See FIG. 6).

The source and drain regions 222, 226 may be formed by lithography, ion implantation, diffusion and/or other suitable processes. Referring to FIG. 6, according to the desired transistor structures, p-type or n-type dopants or impurities are implanted into the substrate 200 of the NMOS region 201 and PMOS region 202, and then the source/drain regions 222, 226 are annealed to activate the dopants.

After a normal annealing to source/drain regions at high-temperature, in step S105, the device is further annealed in an oxygen environment, such that oxygen in the oxygen environment is diffused into the high-k gate dielectric layer 206 of the second gate stack 400 through the buffer layer 218 for the second sidewall spacer. The annealing temperature is in the range of about 300° C.-800° C., the annealing time is in the range of about 1 to 3000 seconds, and the annealing protective gas is O2. Since the buffer layer 218 for the second sidewall spacer is formed of a porous-structure low-k dielectric material, the oxygen atoms can be diffused along the passage of the buffer layer 218 for the second sidewall spacer in a direction as indicated by the arrow in FIG. 6 into the second high-k gate dielectric layer 206, so as to supplement the oxygen vacancies in high-k gate dielectric layer material incurred during integration processes, and thus lower the PMOS threshold voltage.

Described above is a method which comprises forming a buffer layer 218 for the second sidewall spacer on PMOS region 202 and then performing annealing after the formation of the sidewall spacers on NMOS and PMOS regions to supplement the oxygen vacancies and a device obtained by the method. In the method according to the first embodiment of the present invention, the buffer layer 218 for the second sidewall spacer is formed only on the sidewalls of the second gate stack 400 in the PMOS region 202, the sidewalls of the first gate stack 300 in the NMOS region 201 is directly covered by the first sidewall spacer 228, and the buffer layer 218 for the second sidewall spacer is formed of a porous low-k material, for example, SiCOH, SiO, and SiCO, etc. The first sidewall spacer 228 is a relatively compacted material, for example, Si3N4. Therefore, after high-temperature annealing in an oxygen environment, oxygen atoms are diffused along the buffer layer 218 for the second sidewall spacer into the second high-k dielectric layer to further lower the threshold voltage of the PMOS device. At the same time, under the protection of the first sidewall spacer 228 made of Si3N4, the oxygen atoms will be not diffused into the NMOS device, and thus, the threshold voltage of the NMOS device will not be affected. Besides, since the high-temperature annealing process is carried out after the formation of the sidewall spacers for the NMOS and PMOS, the gate and substrate of the device are protected from being damaged. Thus, the threshold voltage of the PMOS device is effectively controlled, and the overall performance of the device is enhanced.

Embodiment 2

Hereinafter, it will only set forth the aspects that the second embodiment distinguishes from the first embodiment. The portions that are not described should be regarded as being carried out by using the same steps, methods, or processes as the first embodiment, and it is unnecessary to give more details.

Figure 7:
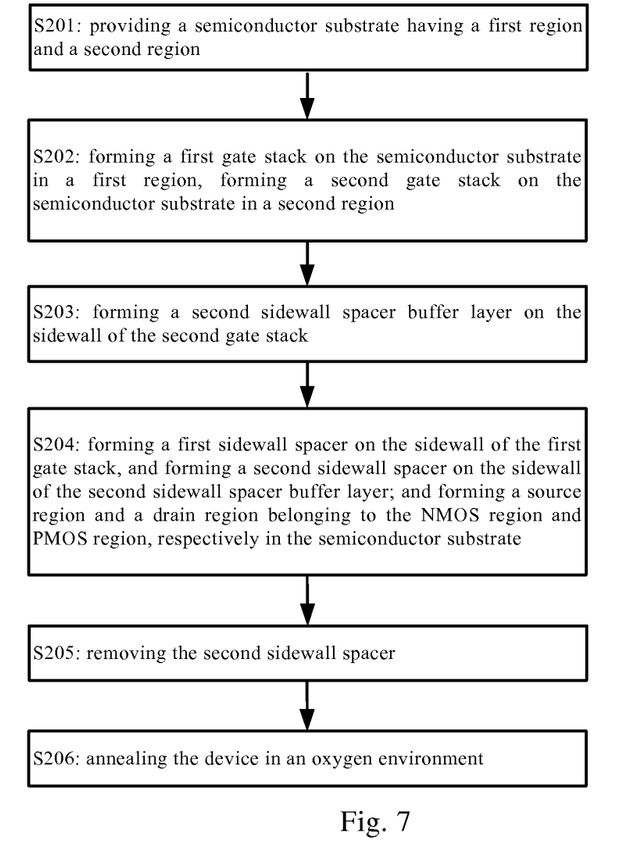
FIG. 7 is a flowchart illustrating a method for manufacturing a semiconductor device according to a second embodiment of the present invention.

With reference to FIG. 7, FIG. 7 is a flowchart of a method for manufacturing a semiconductor device according to a second embodiment of the present invention. Steps S201 to S204, according to the second embodiment of the present invention, are identical to steps S101 to S104 in the first embodiment, and are regarded as being carried out by using the same steps, methods, or processes as the first embodiment. Thus, it is unnecessary to give more details.

Figure 8:
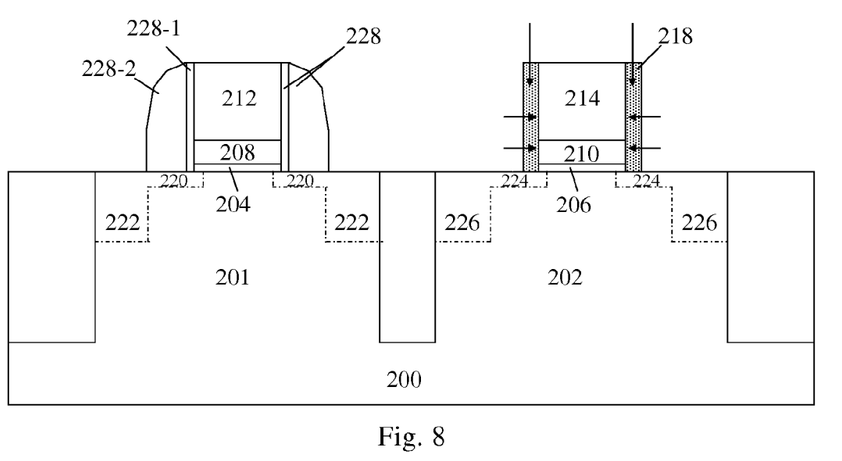
FIG. 8 is a diagram illustrating the stages for manufacturing a semiconductor device according to the second embodiment of the present invention.

In step S205, the second sidewall spacer 230 belonging to the PMOS region 202 is removed. The NMOS region 201 is masked, and then dry or wet etching is used to remove the second sidewall spacer 230 in the PMOS region 202, as shown in FIG. 8.

In step S206, the device is annealed in an oxygen environment, such that oxygen in the oxygen environment is diffused into the high-k gate dielectric layer 206 of the second gate stack 400 through the buffer layer 218 for the second sidewall spacer. The annealing temperature is in the range of about 300° C.-800° C., the annealing time is in the range from about 1 to 3000 seconds, and the protective gas during annealing is O2. Since the buffer layer 218 for the second sidewall spacer is formed of a porous-structure low-k dielectric material, the oxygen atoms can be diffused in the vertical direction and the direction towards the sidewalls of a passage of the buffer layer 218 for the second sidewall spacer, as indicated by the arrows in FIG. 8, so as to be diffused into the second high-k gate dielectric layer 206 to supplement oxygen vacancies of high-k gate dielectric layer material incurred during the integration process, and further lower the PMOS threshold voltage. Compared with the first embodiment of the present invention, the second embodiment have more directions for oxygen diffusion in the diffusion passage of the buffer layer 218, so that it has a better diffusion effect.

Described above is a method that comprises forming the buffer layer 218 for the second sidewall spacer on the PMOS region 202 and then annealing the device after the formation of a sidewall spacer on the NMOS region to supplement the oxygen vacancies and a device obtained by the method. In the method according to the second embodiment of the present invention, the buffer layer 218 is formed only on the sidewalls of the second gate stack 400 in the PMOS region 202, the sidewalls of the first gate stack 300 in the NMOS region 201 is directly covered by the first sidewall spacer 228, and the buffer layer 218 for the second sidewall spacer is formed of a porous low-k material, for example, SiCOH, SiO, and SiCO, etc. The first sidewall spacer 228 is a relatively dense material, for example, Si3N4. Therefore, after a high-temperature anneal in an oxygen environment, oxygen atoms diffuse along the buffer layer 218 into the second high-k dielectric layer to further lower the threshold voltage of the PMOS device. At the same time, under the protection of the first sidewall spacer 228 of Si3N4, the oxygen atoms will not be diffused into the NMOS device, and thus the threshold voltage of the NMOS device will not be affected. Accordingly, the threshold voltage of the PMOS device is effectively controlled and the overall performance of the device is enhanced.

Although the embodiments and their advantages have been described in detail, it is readily apparent to those having ordinary skill in the art that various alterations, substitutions and modifications may be made to the embodiments without departing from the spirit of the present invention and the scope as defined by the appended claims. For other examples, it may be easily recognized by a person of ordinary skill in the art that the order of the steps in a process may be changed without departing from the scope of the present invention.

In addition, the scope to which the present invention is applied is not limited to the processes, mechanism, manufacture, material composition, means, methods and steps described in the specific embodiments in the specification. A person of ordinary skill in the art would readily appreciate from the disclosure of the present invention that the processes, mechanism, manufacture, material composition, means, methods and steps currently existing in the art or to be developed in future, which perform substantially the same functions or achieve substantially the same effects as those in the corresponding embodiments described in the present invention, may be applied according to the present invention. Therefore, it is intended that the scope of the appended claims of the present invention includes these processes, mechanism, manufacture, material composition, means, methods or steps.

What is claimed is:

1. A method for manufacturing a semiconductor device, comprising:
   providing a semiconductor substrate having an NMOS region and a PMOS region;
   forming a first gate stack in the NMOS region on the semiconductor substrate, and
   forming a second gate stack in the PMOS region on the semiconductor substrate, wherein the formation of the first gate stack comprises forming a first high-k gate dielectric layer and a first metal gate electrode thereon, and the formation of the second gate stack comprises forming a second high-k dielectric layer and a second metal gate electrode thereon;
   forming a buffer layer on sidewalls of both of the first gate stack and the second gate stack, wherein the buffer layer is formed of a low-k dielectric material;
   removing the buffer layer on sidewalls of the first gate stack, and only keeping the buffer layer on sidewalls of the second gate stack;
   forming a first sidewall spacer on sidewalls of the first gate stack, and forming a second sidewall spacer on sidewalls of the buffer layer;
   forming a source region and a drain region for each of the NMOS region and PMOS region in the semiconductor substrate; and
   annealing the device in an oxygen environment, such that oxygen in the oxygen environment being diffused into the second high-k gate dielectric layer of the second gate stack through the buffer layer.

2. The method according to claim 1, wherein the low-k dielectric material for forming the buffer layer has a relative dielectric constant less than 3.5.

3. The method according to claim 1, wherein the low-k dielectric material for forming the buffer layer comprises: SiCOH, SiO or SiCO.

4. The method according to claim 1, wherein the buffer layer has a thickness in the range of 1-100 nm.

5. The method according to claim 1, wherein the annealing temperature is in the range of 300° C. - 800° C.

6. The method according to claim 1, wherein the annealing time is in the range of 1- 3000 seconds.

7. A method for manufacturing a semiconductor device, comprising:
   providing a semiconductor substrate having an NMOS region and a PMOS region;
   forming a first gate stack in the NMOS region on the semiconductor substrate, and
   forming a second gate stack in the PMOS region on the semiconductor substrate, wherein the formation of the first gate stack comprises forming a first high-k gate dielectric layer and a first metal gate electrode thereon, and the formation of the second gate stack comprises forming a second high-k dielectric layer and a second metal gate electrode thereon;
   forming a buffer layer on sidewalls of both of the first gate stack and the second gate stack, wherein the buffer layer is formed of a low-k dielectric material;
   removing the buffer layer on sidewalls of the first gate stack, and only keeping the buffer layer on sidewalls of the second gate stack;
   forming a first sidewall spacer on sidewalls of the first gate stack, and forming a second sidewall spacer on sidewalls of the buffer layer;
   forming a source region and a drain region for each of the NMOS region and PMOS region in the semiconductor substrate;
   removing the second sidewall spacer; and
   annealing the device in an oxygen environment, such that oxygen in the oxygen environment is diffused into the second high-k gate dielectric layer of the second gate stack through the buffer layer.

8. The method according to claim 7, wherein the low-k dielectric material has a relative dielectric constant less than 3.5.

9. The method according to claim 7, wherein the low-k dielectric material for forming the buffer layer comprises: SiCOH, SiO or SiCO.

10. The method according to claim 7, wherein the buffer layer has a thickness in the range of 1-100 nm.

11. The method according to claim 7, wherein the annealing temperature is in the range of 300° C. -800° C.

12. The method according to claim 7, wherein the annealing time is in the range of 1- 3000 seconds.

* * * * *